United States Patent
Masood et al.

(10) Patent No.: US 6,810,067 B2
(45) Date of Patent: Oct. 26, 2004

(54) SINGLE MODE GRATING-OUTCOUPLED SURFACE EMITTING LASER WITH BROADBAND AND NARROW-BAND DBR REFLECTORS

(75) Inventors: Taha Masood, Plano, TX (US); Steven Gregory Patterson, Plano, TX (US); Gary A. Evans, Plano, TX (US)

(73) Assignee: Photodigm, Inc., Richardson, TX (US)

( * ) Notice: Subject to any disclaimer, the term of this patent is extended or adjusted under 35 U.S.C. 154(b) by 18 days.

(21) Appl. No.: 10/255,443

(22) Filed: Sep. 26, 2002

(65) Prior Publication Data

US 2004/0062286 A1 Apr. 1, 2004

(51) Int. Cl.[7] .................................................. H01S 3/08
(52) U.S. Cl. ............................ 372/102; 372/43; 372/45; 372/46
(58) Field of Search ............................. 372/102, 45, 46

(56) References Cited

U.S. PATENT DOCUMENTS

| | | | |
|---|---|---|---|
| 5,131,001 A | * 7/1992 | Carlson | 372/50 |
| 5,738,825 A | 4/1998 | Rudigier et al. | 422/82.11 |
| 5,805,750 A | * 9/1998 | Bates | 385/37 |
| 6,429,022 B1 | * 8/2002 | Kunz et al. | 436/164 |
| 6,436,613 B1 | * 8/2002 | Fallahi et al. | 430/321 |
| 6,504,180 B1 | * 1/2003 | Heremans et al. | 257/98 |

* cited by examiner

*Primary Examiner*—Don Wong
*Assistant Examiner*—Dung T Nguyen
(74) *Attorney, Agent, or Firm*—Duke W. Yee; Patrick C. R. Holmes

(57) ABSTRACT

A laser source is provided by the present invention, comprising a laser diode and has an active region with asymmetric distributed Bragg reflectors (DBRs) at either end to reflect light within the cavity, and an outcoupling grating in the center of the device, which couples light out of the cavity. One DBR is long and shallow, with a narrow-band reflective spectrum. The other DBR is short and deep, with a wide-band reflective spectrum. The lasing wavelength is determined by the reflective spectrum overlap of the two DBRs. Since the shallow DBR is highly reflective to only one Fabry Perot wavelength, and the deep DBR is highly reflective to a wide band of Fabry-Perot wavelengths, it is the reflective spectrum of the shallow DBR that determines the lasing wavelength.

8 Claims, 3 Drawing Sheets

SINGLE MODE GRATING-OUTCOUPLED SURFACE EMITTING LASER WITH BROADBAND AND NARROW-BAND DBR REFLECTORS

BACKGROUND OF THE INVENTION

1. Technical Field

The present application relates to laser diodes, and more particularly to asymmetric distributed Bragg reflector configuration for single mode operation.

2. Description of Related Art

Transmission of light through waveguides has been pursued for many types of communications applications. Light signals offer many potential advantages over electronic signals. Light sources are commonly created from semiconductor devices, and include semiconductor devices such as LEDs (Light Emitting Diodes) and LDs (Laser Diodes).

Optical fiber is the most commonly used transmission medium for light signals. A single fiber is capable of carrying several different modulated signals within it at one time. For instance, wavelength division multiplexing divides the used bandwidth of the fiber into different channels (each channel containing a small range of wavelengths) and thus transmits several different wavelengths (or signals) of light at once. Using such a system requires sources for the different wavelengths. More wavelengths on the fiber require more sources to be coupled to the fiber.

Efficient coupling of light into a fiber is simplified if the laser beam has a cross sectional profile that matches the profile of the fiber mode(s). Efficient use of light for communications requires that the light have high temporal coherence. Efficient coupling of light to monomode guides requires spatial coherence. Spatial coherence requires the laser to operate in a single lateral and transverse mode. Temporal coherence requires the laser to operate in a single longitudinal mode and implies a very narrow bandwidth, or range of wavelengths.

The most coherent semiconductor lasers use resonators based on grating feedback rather than Fabry-Perot resonators with reflective end facets. Distributed feedback (DFB) lasers use a Bragg reflective grating covering the entire pumped length of the laser. An alternative to DFB lasers is the use of distributed Bragg reflectors (DBRs) located outside the pumped region.

In conventional DFB and DBR lasers, light is removed through an end facet and the output beams have dimensions entirely controlled by the vertical (i.e., normal to the surface) (x) and lateral (y) size and the composition of the guiding structure. Such output beams typically have too great a divergence for effective coupling to optical fibers, or for other applications requiring beams with low divergence angles.

Beam dimensions (in at least one direction) larger than that available from laser facets may be obtained by using a Bragg grating to couple light out of the waveguide normal (or at certain fixed angles) to the waveguide surface. So called second order Bragg gratings have a period equal to the wavelength of light of the guided mode. The second grating order of such a grating reflects some of the light back in the waveguide plane while the first order couples some of the light normal to the plane. So called first order (Bragg) gratings have a period equal to one half the wavelength of light in the guided mode, reflect light in the waveguide plane, and do not couple light out of the waveguide. First, second, and third order (etc.) gratings are sometimes referred to as being in resonance. A non-resonant grating couples light out of the waveguide at an angle to the normal and does not reflect any light in the waveguide plane.

U.S. Pat. No. 5,970,081 to Hirayama et al. appears to show a laser with a distributed feedback (DFB) grating of second order or higher that claims to obtain a Gaussian shaped output beam by narrowing the waveguide or using a chirped grating at the outcoupling portion. They do not seem to recognize that by so doing the resonant wavelength of the grating is altered along the length of the narrowing or chirping. This would be expected to result in an output which will fan in angle along the longitudinal direction rather than produce a simple Gaussian intensity variation emitted normal to the plane as claimed. They do not define the beam shape in the lateral direction. In all versions they choose second order outcoupling gratings which, absent a narrowing waveguide or chirp, would emit light perpendicular to the surface of the laser waveguide.

U.S. Pat. No. 4,006,432 to Streifer et al. appears to show a grating out-coupled surface emitting DFB laser. The grating period may be chosen to be either resonant or not.

A paper by Bedford, Luo, and Fallahi titled Bow-Tie Surface-Emitting Lasers (IEEE Photonics Technology Letters, Vol. 12, No. 8, August 2000) appears to show a DBR laser with curved second order grating at the ends to couple light out of the waveguide. The same gratings are used for outcoupling and for reflecting the light within the waveguide. They mention the use of non-resonant gratings in conjunction with reflector gratings if emission at other than the direction normal the waveguide plane is desired. The paper appears to show a flared resonator region which allows symmetric outcoupling from both ends of the laser. This facilitates two outputs that are coherent with one another, with emission in the same direction. Such a device is meant to alleviate the complications of controlling the relative phase between the two emitters.

The Tiberio article (Facetless Bragg reflector surface-emitting AlGaAs/GaAs lasers . . . , J. Vac. Sci. Technol., B9(6), 1991) appears to show a surface emitting laser diode that uses first order reflective gratings and either second order (or non-resonant) gratings for outcoupling. Thus, depending on the chosen grating period, the outcoupled beam can be normal or at an angle to the surface.

U.S. Pat. No. 6,064,783 to Congden appears to show a DBR laser with a grating assisted waveguide coupler that couples light from the laser waveguide to a parallel fiber-like glass waveguide for later coupling to a fiber. Several different lasers are coupled to similar fiber-like glass waveguides in the figures. The fiber axis is parallel to the laser waveguides. This reference mentions that this model is easily attached to a fiber through "butt coupling." The grating acts as a Quasi Phase Matching element to couple the light from the laser waveguide to the fiber-like glass waveguide.

Symmetric, grating-outcoupled, surface emitting lasers (GO-SELs) employ a configuration with shallow, long, narrow-band DBRs at both ends of the laser cavity, with an outcoupling grating in the middle. For symmetric devices, the reflectivity spectrum of both DBRs must overlap for lasing to occur. However, this overlap is much harder to achieve during wafer processing in symmetric designs because of process variations between the DBRs. In symmetric GO-SELs, both DBRs have very narrow reflective spectrum widths. Limitations in the manufacturing process usually produce slight reflectivity variations between the two DBRs, thus preventing both DBRs from having exactly the same reflective spectrum width. This slight variation in reflective spectrum widths results in two laser wavelengths, rather than one, thus reducing light coherence. In addition, temperature variations can also reduce laser coherence by causing changes in the reflectivity spectrum of the DBRs.

Therefore, it would be desirable to have a GO-SEL design that allowed for single mode operation, without the need to exactly match narrow DBR reflective spectrum widths.

SUMMARY OF THE INVENTION

The present invention provides a laser source comprising a laser diode and has an active region with distributed Bragg reflectors (DBRs) at either end to reflect light within the cavity, and an outcoupling grating in the center of the device, which couples light out of the cavity. On either side of the outcoupling grating is a gain region with electrical contacts for supplying current. In some embodiments, the outcoupling grating may be at the end of a gain region with only a DBR and not a gain region on the other side.

The DBRs are asymmetric. One DBR is long and shallow, with a narrow-band reflective spectrum. The other DBR is short and deep, with a wide-band reflective spectrum. The lasing wavelength is determined by the reflective spectrum overlap of the two DBRs. Since the shallow DBR is highly reflective to only one Fabry Perot wavelength, and the deep DBR is highly reflective to a wide band of Fabry-Perot wavelengths, it is the reflective spectrum of the shallow DBR that determines the lasing wavelength. This allows the asymmetric device to produce a single-wavelength laser without the need to match the reflective spectrum widths of the DBRs.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1b depicts a top view of the GO-SEL depicted in FIG. 1a;

DETAILED DESCRIPTION OF THE PREFERRED EMBODIMENT

Figure 1A:
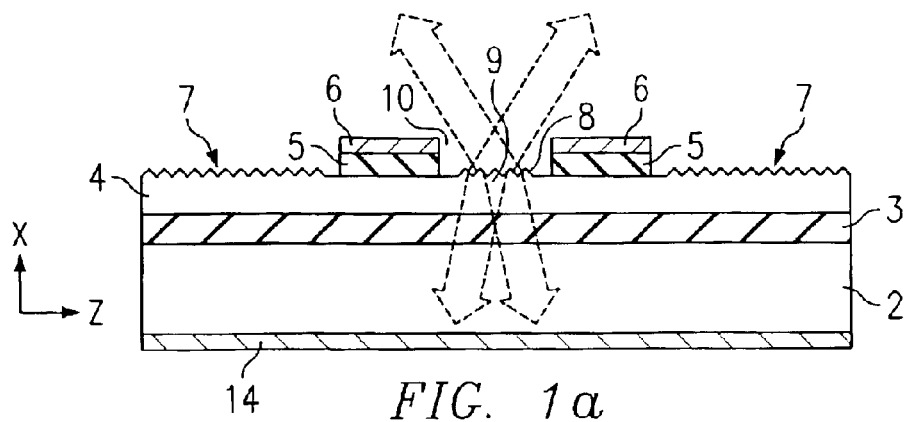
FIG. 1a depicts a cross sectional schematic diagram illustrating a grating-coupled surface emitting laser (GO-SEL) in accordance with the prior art.

The numerous innovative teachings of the present application will be described with particular reference to the presently preferred embodiment (by way of example, and not of limitation).

First order outcoupling gratings and second order or higher outcoupling gratings are both used in at least some embodiments of the present innovations. In the present application, first order DBR refers to a distributed Bragg reflector grating that reflects light within the waveguide in first order for feedback. A second order DBR grating will outcouple light in first order, and feedback light in second order.

In several variations in this application, second order feedback gratings (which couple light out in first order) are used. In such arrangements, the feedback grating depth or strength is varied in the y and z directions so that both the loss and the feedback from the grating help to stabilize the laser mode. For example, the first order lateral mode will be stabilized if the grating strength is varied so that the feed back varies like a Gaussian. This is accomplished by forming the grating so that its strength varies as $$1-\exp[-(y/\omega)^2]$$

where y is the direction parallel with the feedback grating surface and perpendicular to the cavity length, with the origin taken to be at the center of the out-coupling grating, and omega is half the y grating dimension.

First order outcoupling gratings are gratings which couple light out of the waveguide plane in first order but may or may not satisfy the in-plane Bragg condition for second or higher order Bragg reflection. Such gratings may be designed to create no second or higher order reflections which feedback into the laser mode. In these variations which use such out-coupling gratings with no in-plane feedback, the gratings cause no destabilizing feedback into the laser mode and are mechanically and electrically isolated from the structure used to form and pump the resonant laser cavity. Thus, the length and position of the output grating can be chosen to suit the needs of the application for which the laser is designed. The grating periods required for outcoupling, with and without in-plane reflections, are summarized in "Surface Emitting Semiconductor Lasers and Arrays," G. A. Evans and J. M. Hammer, Eds., Academic Press, 1993, which is hereby incorporated by reference.

In general, second and higher order feedback gratings can result in some outcoupling. However, these are less preferred in the context of the present application since such higher order interactions are less efficient.

The outcoupling angle of the gratings in the innovative systems herein disclosed is measured as an angle from the normal to the surface of the outcoupling grating. Resonant outcoupling occurs when the outcoupling grating has a period that is equal to an integer number of wavelengths of the light in the cavity. A grating with period equal to the wavelength of light in the laser cavity will outcouple some light normal to the laser plane and reflect some light in-plane in second order. This means the light exits the grating parallel or nearly parallel to the normal. Outcoupling of light off the normal occurs when the grating is not an integer number of guide wavelengths, and in such a case the light exits the grating at an angle from the normal. This angle depends on the difference between the guide wavelength and the grating period. Varying the wavelength of light or the outcoupling grating period can therefore have great effect on the angle of outcoupled light. The out-coupling grating length, longitudinal position, and the output angles may therefore be chosen over a large range of values. The grating may also be shaped to achieve an output beam of a desired cross section. This is valuable for coupling the output light into fibers of different cross sectional size or at different angles than exactly or nearly normal. All of these "off normal" parameters may be varied without fear of significant mode destabilization or disruption of laser coherence. In the case of exactly or near normal outcoupling, there can be significant in-plane reflection that may (or may not) adversely affect the performance of the laser.

Referring now to the figures, and in particular to FIG. 1a, a cross sectional schematic diagram illustrating a grating-coupled surface-emitting laser (GO-SEL) is depicted in accordance with the prior art. FIG. 1a is taken to show the x-z plane. It should be understood that the features in the several figures may not be to exact scale because of the large differences in dimension between the various structures illustrated.

Layers 3, 4, 5, and 6 are grown on a substrate 2 by known means. Each of these layers may comprise a number of sub-layers. Beneath the substrate is the n contact layer 14. The substrate may comprise a thick layer of n-type semiconductor with a top layer of similar n-type material interposed beneath layer 3. This is frequently called the n-cladding or n-clad. The n-clad will have a refractive index below that of layer 3. Layer 3 is the active and guiding layer usually containing the junction between p- and n-type semiconductor materials. It may comprise, for example, a sequence of one or more barrier layers alternating with quantum well layers. Layer 4 is a p-type clad layer and has lower refractive index than layer 3. Layer 5 may be a multi-layer including a p-clad material chosen to enable good contact to 6, which is the p-metallic contact. Layer 14 provides the other electrical contact for the laser. There are many sequences of possible layers for semiconductor lasers and amplifiers, and the present innovations are not limited to the structures recited here. For example, a structure with a p-type rather than an n-type substrate (and all the necessary alterations to accommodate a change from p- to n-type materials and vice versa) is within the contemplation of the present application.

Gratings 7 are surface relief DBR gratings chosen to reflect light in the +/−z direction to form the laser cavity. (Note that these gratings can be buried structures within the device, and the term "surface relief" does not require the grating be on the surface of the device after processing.) The laser mode will be a standing wave, which may be considered formed by two waves one flowing in the +z direction, the other in the −z direction. First order DBR gratings are preferred, but second or higher order gratings are also possible. The DBR grating depth and length and the thickness of layer 4 are chosen to provide the desired feedback as known in the art.

The reflector gratings can be given added functionality by varying their grating strength or amplitude in both the y (lateral) direction and the z (cavity) direction. Variation of the grating strength in the lateral direction will impart to the cavity mode light a Gaussian shape, allowing for more of the optical energy of the emitted light to be coupled into a circular mode, such as a fiber. Variation of the grating strength in the z direction can improve the suppression of unwanted longitudinal modes on either side of the desired longitudinal mode. The degree to which the unwanted modes are suppressed is called the side-mode suppression ratio.

The outcoupling grating 8 (sometimes referred to herein as OC grating, or OCG) is a surface relief grating with period chosen to couple light at desired angles from the grating plane. It is located at an aperture on the surface of the device. The outcoupling gratings are about 10 microns wide. The outcoupling grating may be shaped to control the shape of the emitted beam. The grating depth and thickness of the p-clad layer 9 in the vicinity of the grating 8 are chosen to provide the desired degree of outcoupling and to control beam shape. A window or aperture 10 in layers 5 and 6 is provided to allow unobstructed emission of light, and the size and shape of the outcoupling grating is matched to the mode of the fiber to which it couples light (in one embodiment). Because of the two standing waves in the cavity and reflection from the grating, the outcoupling grating simultaneously emits four different light beams, two above and two below the grating plane. These are depicted by dashed arrows. In the case of normal outcoupling of the laser light, the two top lobes are combined into a single beam, as are the two bottom lobes of emitted light.

In one embodiment, the outcoupled light is emitted normal to the surface, since one primary goal is to couple this light into a fiber. When light is emitted normal to the surface, the two top emitted beams are combined into a single beam, and likewise with the downward emitted beams. Off normal emissions and slightly off normal emissions are also very useful. For example, changing the angle of entry to a fiber by several degrees has minimal impact on the coupling efficiency yet allows the use of an off resonance grating which minimizes undesired feedback into the laser. A larger angle might be desirable to send light to another detector to monitor the laser.

Figure 1B:
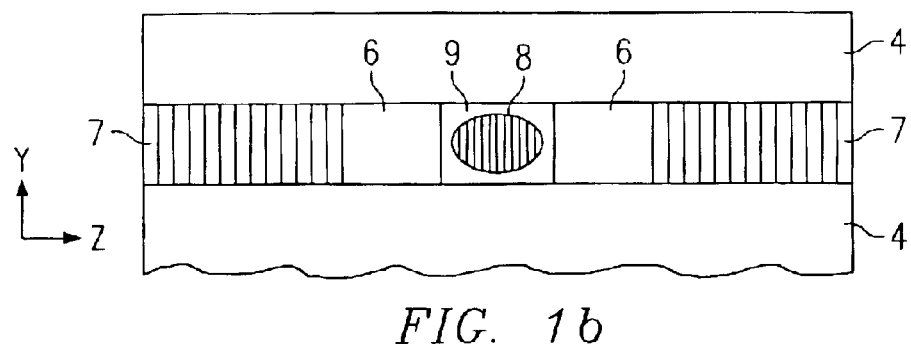

FIG. 1b shows a top view of the GO-SEL depicted in FIG. 1a. The outcoupling grating 8 is located at an outcoupling aperture within the envelop of the gain region. On either end of the laser are located distributed Bragg reflectors 7 for providing feedback into the cavity. Of course, cleaved facets may also be used instead of reflector gratings, with highly reflective coatings applied to reflect the light, as shown in later embodiments. With either DBR reflectors or coated facets, the reflectivity of one or both ends can be varied to allow light to escape the cavity for other purposes.

Figure 2:
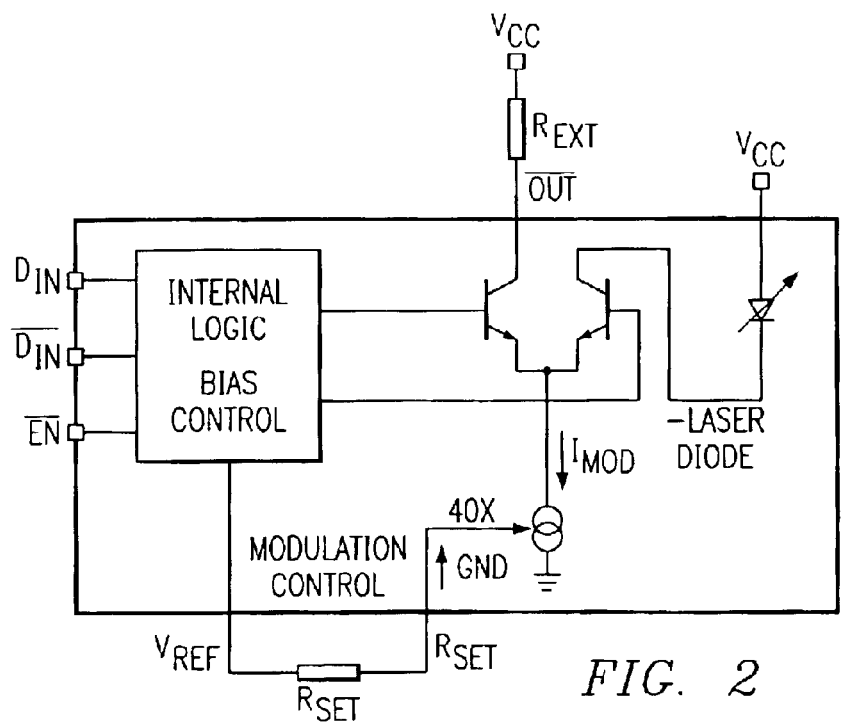
FIG. 2 depicts a schematic diagram illustrating a higher level circuit integration on the same chip as the GO-SEL diode in accordance with the present invention.

Referring to FIG. 2, a schematic diagram illustrating a higher level circuit integration on the same chip as the GO-SEL diode is depicted in accordance with the present invention. In this example, laser driver and control electronics are integrated. Din and Din-bar are differential data inputs and EN is the chip enable. Internal logic and BIAS control is used to center the data to the inputs of the driver pair and to provide a Vref output. This output is used with Rset to control the current source or modulation current Imod which sets the output current to the grating outcoupled laser diode. The resistor Rext is external to minimize the power dissipation capacity, both Rext and Rset may be integrated as well.

Figure 3:
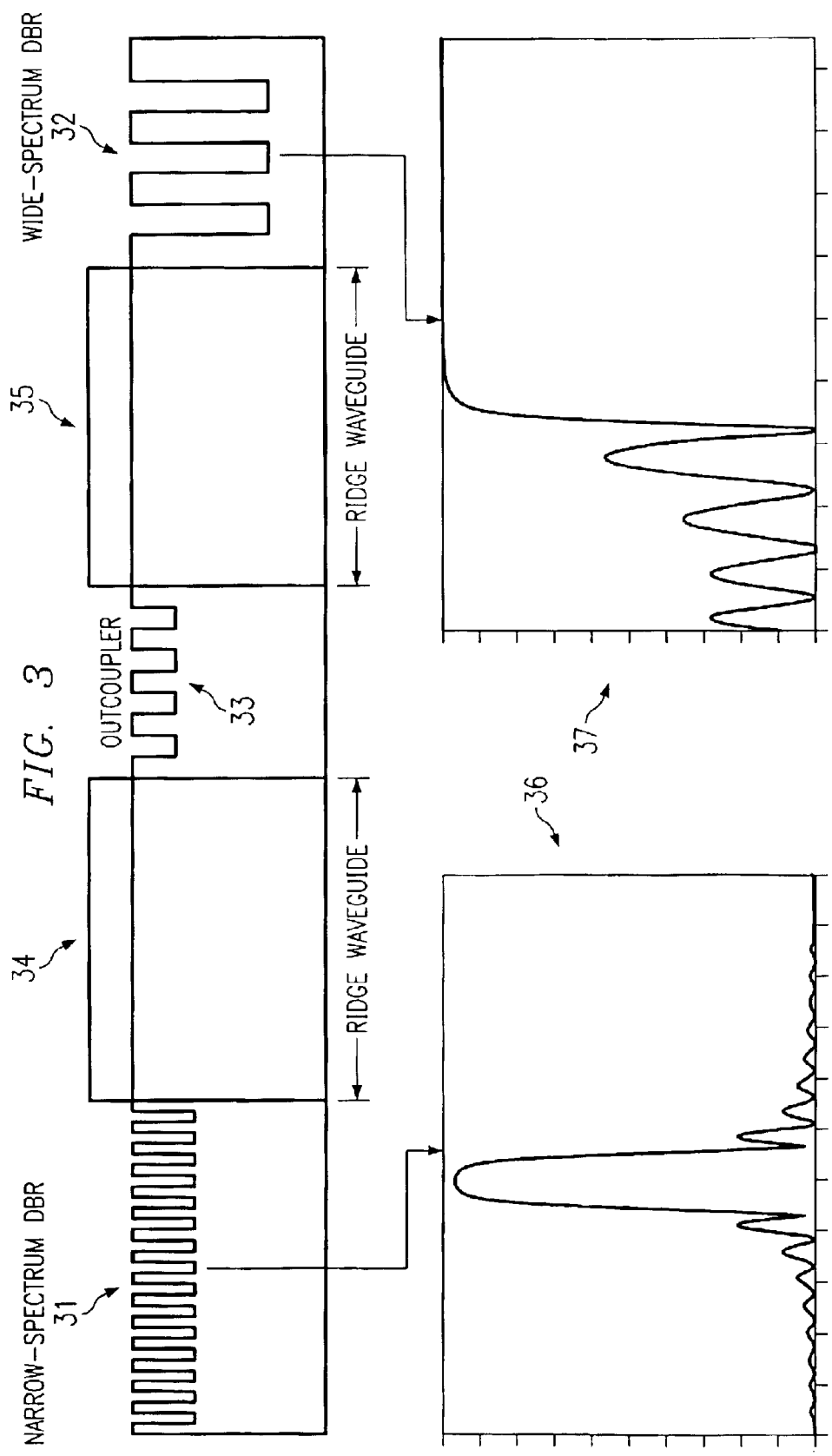
FIG. 3 depicts a diagram illustrating an asymmetric single mode GO-SEL in accordance with the present invention.

Referring now to FIG. 3, a diagram illustrating an asymmetric single mode GO-SEL is depicted in accordance with the present invention. The laser diode in the present invention has a shallow, long, narrow-band DBR 31 at one end of the cavity and a deep, short, wide-band DBR 32 at the other end. An outcoupling grating 33, which can be anywhere between the two DBRs 31 and 32, couples light out of the cavity. On either side of the outcoupling 33 grating are two gain regions 34 and 35 with electrical contacts for supplying current.

For both symmetric and asymmetric Go-SEL devices, the reflectivity spectrum of both DBRs must overlap for lasing to occur. However, this overlap is much harder to achieve during wafer processing in symmetric designs because of process variations between the DBRs. In symmetric GO-SELs, both DBRs have very narrow reflective spectrum widths. Limitations in the manufacturing process usually produce slight reflectivity variations between the two DBRs. This variation in reflective spectrum widths results in two laser wavelengths, rather than one, thus reducing light coherence.

In the present invention, the long, shallow DBR 31 is highly reflective to only a single Fabry Perot-wavelength, as depicted in graph 36. By contrast, the deep, short DBR 32 is 100 percent reflective across a wide band of wavelengths, as depicted in graph 37. The overlap of the reflectivity spectrum of the two DBRs 31 and 32 determines the lasing wavelength that reaches resonance in the laser cavity. Therefore, it is the depth of the long, shallow DBR 31 that determines the lasing wavelength, since the depth of this DBR is what determines the reflectivity overlap with the deep, short DBR 32. Because the narrow reflectivity spectrum can easily overlap the wide spectrum of the deep DBR 32, the asymmetric design can produce a single-wavelength laser, while avoiding the problem of matching narrow reflectivity spectra between the DBRs.

First, second, and third (or fifth) order gratings can be used in all embodiments of the present invention. A first order, narrow-band DBR is used to reflect light back into the laser cavity. The selected lasing wavelength spectrum shows high side mode suppression. A second order DBR is used to outcouple light out of the cavity, and the third (or fifth) order, deep DBR provides the wide-band, near 100 percent reflectivity.

Due to the short, deep DBR 32 at one end of the laser cavity, the effective cavity length of the laser is smaller for the asymmetric design than it would be for a symmetric design. This results in improved dynamic response characteristics of the laser device, which can then be modulated at higher frequencies.

Asymmetric GO-SEL devices are also less sensitive to temperature variations, particularly during manufacture. As temperature changes, the reflectivity spectrum of the shallow DBR 31 shifts but still overlaps the wide spectrum of the deep DBR 32.

The asymmetric DBR configuration produces a smaller device compared to symmetric GO-SEL devices, which have long DBRs at both ends of the cavity. This asymmetric design improves the device aspect ratio and increases the number of devices that can be placed on a single wafer.

Figure 4:
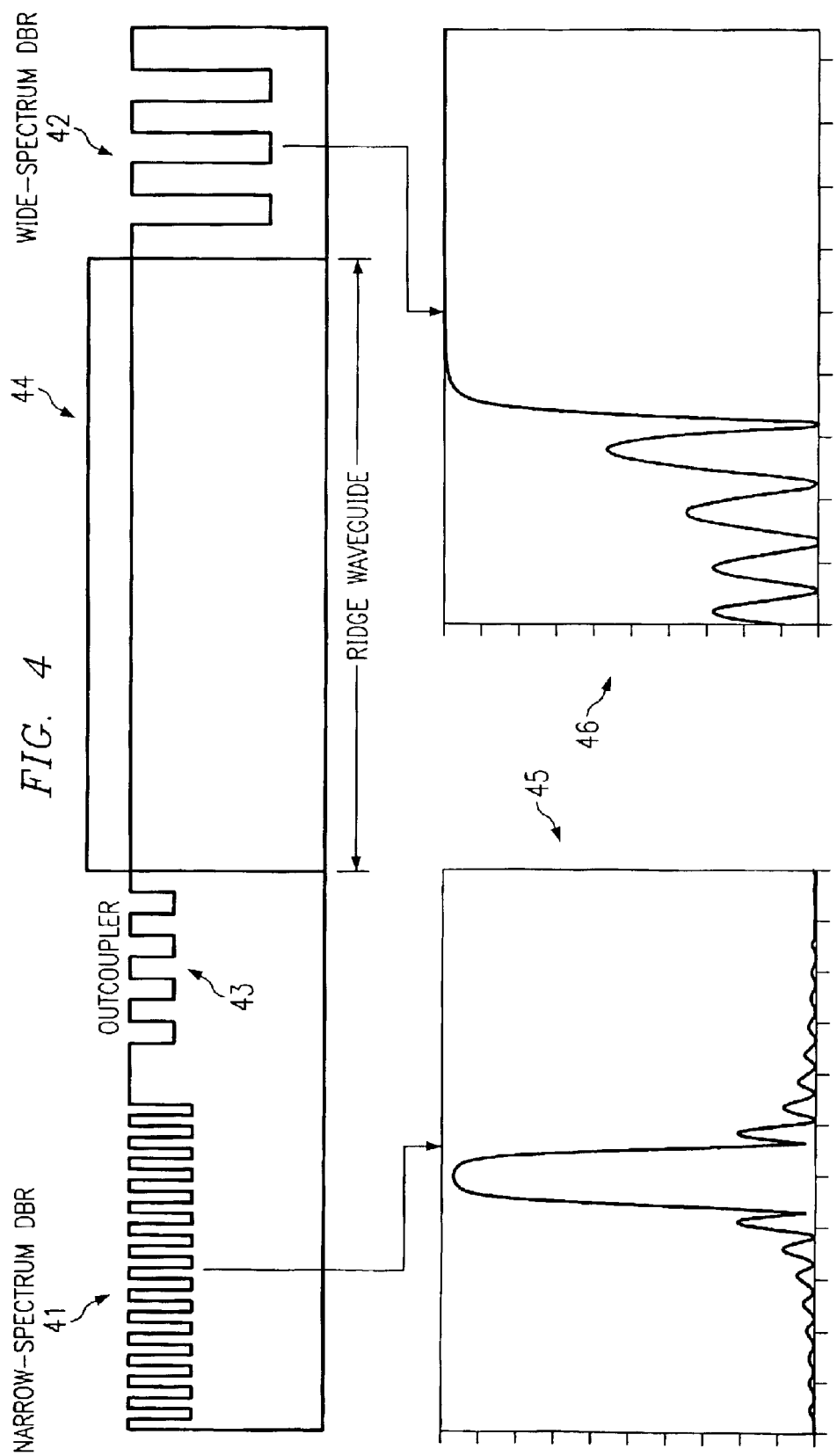
FIG. 4, an alternate embodiment of the asymmetric GO-SEL is depicted in accordance with the present invention.

Referring to FIG. 4, an alternate embodiment of the asymmetric GO-SEL is depicted in accordance with the present invention. The only difference between this embodiment and the one depicted in FIG. 3, is that the outcoupling grating 43 is at one end of the cavity, with a single continuous gain region 44 on one side, rather than two shorter gain regions an either side. By using a larger continuous gain region 44, rather than two smaller ones, the number of contact interfaces at the ends of the gain region 44 is reduced. These interfaces produce field overlap losses. Therefore, by reducing the number of interfaces from four to two, the amount of field overlap loss is cut in half.

The following background publications provide additional detail regarding possible implementations of the disclosed embodiments, and of modifications and variations thereof, and the predictable results of such modifications. All of these publications are hereby incorporated by reference: "Surface Emitting Semiconductor Lasers and Arrays," Ed. Evans and Hammer, Academic Press, 1993; "Research Toward Optical Fiber transmission Systems Part 1," Proc. IEEE, 61, 1703–1751, December 1973; "Optimized Couplers Between Junction lasers and Single Mode Fibers," Hammer, Neil, RCA laboratories, Princeton, N.J., Final Report, Aug. 31, 1981-Jan. 31, 1983; "Observations and Theory of High Power Butt Coupling to LiNbO$_3$-type waveguides," Hammer and Neil, IEEE J. Quantum Electronics, QE-18, 1751–1758, October 1982; "Laser Diode End Fire Coupling into Ti:LiNbO$_3$ waveguides," Appl, Optics, 18, 2536–2537, August 1979.

As will be recognized by those skilled in the art, the innovative concepts described in the present application can be modified and varied over a tremendous range of applications, and accordingly the scope of patented subject matter is not limited by any of the specific exemplary teachings given.

The outcoupling element in the disclosed embodiments can be a grating as described, or a holographic optical element, a lens, or any other outcoupling device. For example, a beam splitter properly positioned can also couple light out of the cavity. Blazed gratings may also be used. Circular gratings (which produce a fanned light output) can also be used in some applications. The innovative structures can also include DFB gratings rather than DBRs to reflect cavity mode light.

The waveguide structure can be of different forms, for example, a ridge waveguide or a buried heterojunction.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A laser diode system, comprising:
   a laser cavity;
   a first reflective grating at one end of the laser cavity, wherein the first grating has a reflective spectrum substantially covering only a single Fabry Perot wavelength;
   a second reflective grating at the opposite end of the laser cavity, wherein the second grating has a reflective spectrum covering a broad band of wavelengths; and
   an outcoupling grating that couples light out of the laser cavity;
   wherein the overlap of the reflective spectra of the first and second reflective gratings determines the lasing wavelength.

2. The laser diode system according to claim 1, further comprising two gain regions, one on either side of the outcoupling grating, with electrical contacts for supplying current.

3. The laser diode system according to claim 1, further comprising a gain region on one side of the outcoupling grating, with an electrical contact for supplying current.

4. The laser diode system according to claim 1, wherein the first and second reflective gratings are distributed Bragg reflectors.

5. The laser diode system according to claim 4, wherein the first reflective grating is a first order distributed Bragg reflector.

6. The laser diode system according to claim 4, wherein the second reflective grating is a third order distributed Bragg deflector.

7. The laser diode system according to claim 4, wherein the second reflective grating is a fifth order distributed Bragg deflector.

8. The laser diode system according to claim 1, wherein the outcoupling grating is a second order distributed Bragg deflector.

* * * * *